United States Patent
Walter-Martin et al.

(10) Patent No.: US 8,290,752 B2
(45) Date of Patent: Oct. 16, 2012

(54) METHOD FOR DESIGNING AN AUTOMOTIVE VEHICLE

(75) Inventors: Jeremy Walter-Martin, Ecully (FR); Bruno Hazet, Versailles (FR); Celine Godard, Clamart (FR); Jerome Mortain, Bois Colombes (FR); Laurent Houillon, Boulogne Billancourt (FR)

(73) Assignee: Peugeot Citroen Automobiles SA, Velizy Villacoublay (FR)

( * ) Notice: Subject to any disclaimer, the term of this patent is extended or adjusted under 35 U.S.C. 154(b) by 504 days.

(21) Appl. No.: 12/520,553

(22) PCT Filed: Dec. 20, 2007

(86) PCT No.: PCT/FR2007/052583
§ 371 (c)(1), (2), (4) Date: Jun. 22, 2009

(87) PCT Pub. No.: WO2008/087334
PCT Pub. Date: Jul. 24, 2008

(65) Prior Publication Data
US 2010/0094596 A1    Apr. 15, 2010

(30) Foreign Application Priority Data
Dec. 22, 2006 (FR) .................. 06 55938

(51) Int. Cl.
*G06F 17/50* (2006.01)
(52) U.S. Cl. .................. 703/1; 703/6; 703/8
(58) Field of Classification Search .......... 703/1, 6, 703/8, 13
See application file for complete search history.

(56) References Cited

U.S. PATENT DOCUMENTS

| | | | |
|---|---|---|---|
| 6,081,654 A * | 6/2000 | Morman et al. .......... | 703/1 |
| 6,560,570 B1 | 5/2003 | Dohrmann et al. | |
| 7,467,074 B2 * | 12/2008 | Faruque et al. .......... | 703/8 |
| 2003/0149500 A1 | 8/2003 | Faruque et al. | |
| 2005/0197822 A1 | 9/2005 | Onodera et al. | |
| 2006/0095235 A1 | 5/2006 | Furtado et al. | |
| 2006/0259283 A1 | 11/2006 | Brughmans et al. | |

FOREIGN PATENT DOCUMENTS

| | | |
|---|---|---|
| EP | 1571597 A | 9/2005 |
| EP | 1715435 A | 10/2006 |

OTHER PUBLICATIONS

International Search Report of PCT/FR2007/052583 mailed Oct. 10, 2008.

* cited by examiner

*Primary Examiner* — Kamini S Shah
*Assistant Examiner* — Herng-Der Day
(74) *Attorney, Agent, or Firm* — Nicolas E. Seckel

(57) ABSTRACT

The present invention relates to a method for designing an automotive vehicle, wherein an automotive module is an automotive vehicle part (1, 2) or a group of automotive vehicle parts, comprising: the step of modeling the automotive modules; the step of mapping the automotive module models; the step of integrating, in a modeling assembly, the links (3) between the automotive modules, which is realized directly between the modules and neither between their models nor between their mappings.

12 Claims, 3 Drawing Sheets

METHOD FOR DESIGNING AN AUTOMOTIVE VEHICLE

The invention concerns the field of methods for designing an automotive vehicle, and in particular an automobile body. In this type of design method, parts or groups of parts are first modeled, then tested.

According to a prior art, it is known, firstly, to model parts or groups of parts in parameterized geometry, then map them, and then to assemble them by integrating the links existing between parts or groups of parts. Thus, integration of the links is performed at the level of an assembly of mappings and not of an assembly of parts or groups of parts.

This prior art has a drawback. That is, in all the situations where the mapping step will need to be performed several times, the step of integrating the links existing between the parts or groups of parts that result in an assembly of the mappings of the parts or groups of parts will need to be performed several times also, which makes this design method longer, and thus more costly.

Thus, the invention proposes to avoid, each time the mapping step is repeated, a corresponding repetition of the step of integrating the links that perform the assembly of the parts or groups of parts linked together. However, all the operations from the mapping must be performed again, since the mapping is different for each repetition, the model on which said mapping is applied being modified for each repetition. Thus, the invention proposes to postpone the mapping step until after the link integration step, so that, for each repetition, it is no longer necessary to perform the link integration step again. As a result of which, the integration of the links results in a geometric assembly of parts or groups of parts, and no longer an assembly of mappings of the parts or groups of parts, or even an assembly of models of parts or groups of parts. The links existing among parts or among groups of parts are thus integrated in the form of links among parts or among groups of parts, and not in the form of links among corresponding mappings, or even among corresponding models. Consequently, thanks to the elimination of the repetition of this link integration step, the design method is made quicker. As will be visible on the Figures described below, the links existing between the automotive modules, once they have been integrated, will be mapped during the mapping step, as the automotive modules are mapped, even though the mapping type may be different. The links existing among the automotive modules, once they have been integrated, are mapped during the mapping step. A link comprises the position of the link as well as the property or properties of the link.

According to the invention, a method for designing an automotive vehicle is provided, wherein an automotive module is an automotive vehicle part or a group of automotive vehicle parts, comprising: a step of modeling automotive modules; a step of mapping models of automotive modules; a step of integrating, in an assembly module, links existing among the automotive modules; characterized in that: the step of integrating the links is performed directly among the automotive modules, and not among their models nor among their mappings.

Preferably, the automotive modules can be modeled in a geometrical form and in a mapped form. Advantageously, at least one of the automotive models, or even several of these automotive models, are actually modeled both in a geometric form and in a mapped form. The mapped form model corresponds to a finite elements representation. The model of the automotive models is then a hybrid model, i.e., both a geometrical representation, preferably a parameterized one, and a mapped representation, i.e., in finite elements, can be associated to each automotive module. The geometrical model exists as a file, but its content can be empty, in which case the automotive model only has a mapped model capable of being used in the subsequent steps of the design method. The possibility of having a mapped model at this upstream stage of design can prove especially interesting, in particular, firstly, for automotive modules that have a geometry too complex to be efficiently parameterized, and secondly, for automotive modules that vary very little, or not at all, during successive iterations for a given operation. From one project to the next, the mapped representation of such an automotive module will often be repeated without modifications or with very small modifications. The step of integrating the links is performed only once among the automotive modules, and not several times for each automotive modules, as would be the case if the assembly were performed among the various geometrical representations associated to the automotive modules, or if the assembly were performed among the various mappings of the models associated with the automotive models.

Preferably, the automotive vehicle design method further comprises at least: a step of associating, to the same assembly model, at least two operations corresponding to instantiations distinct from each other of said assembly model, wherein the mapping step performs, for said operations or for at least two of said operations, mappings distinct from each other of the model of the automotive module or of the model of at least one of the automotive modules. In this case, the method according to the invention is also particularly advantageous, since the assembly of the automotive modules by integration of the links existing among automotive modules can be reused for each operation, after it has been performed once.

Preferably, the mapping step is followed by a step of numerical simulation, in charge of validating the modeling step, wherein the sequence comprising the modeling step, the mapping step and the numerical simulation step is repeated several times. Based on the result of the numerical simulation, the designer parameterizes the model anew, which model is again numerically simulated after the previous process, and so on, with successive iterations, until the model is definitely validated. Here also, the method according to the invention is particularly advantageous, since the assembly of the automotive modules by integration of the links existing among automotive modules can be reused for each iteration of the sequence, after it has been performed once.

Preferably, the assembly model comprises at least one automotive model which is modeled in the form of at least one mapped representation, which representation will not be mapped again during the design method. Thus, for a given operation for which an automotive module varies little, a situation where parameterizing is useless, or is too difficult to vary, a situation where parameterizing is too complex, the mapped representation associated with the module is directly used and makes the subsequent mapping operation useless. In such an advantageous situation, the geometrical representation, which also exists, is empty, however, since the mapped representation is sufficient for any considered operation. In this case, the assembly model comprises at least one automotive module which is uniquely modeled in the form of a representation in finite elements, which representation will no longer be mapped anew during the design method.

In a preferred situation, the method also comprises, between the association step and the mapping step, a step of data production which adds, to each operation, one or several additional elements to the assembly model. This data production step, which must usually be updated during a change of operation, is located before the mapping step, however, so that it does not need to be redone during the various iterations including a numerical simulation for validation, for a same operation. Among the additional element or elements, there is advantageously one or several sensors. That is, adding a sensor that enables an interesting measurement is usually dependent on the considered operation. Among the additional element or elements, there is advantageously one or several masses. That is, adding a mass that enables localized reinforcement of the automotive module is usually necessitated for a given operation. Other entities can be introduced during the data production step.

Preferably, for the instantiation of the links, the association step uses a catalogue that sets forth, for each link, a correspondence between said link and the link instantiations respectively corresponding to the various operations. In this way, automation of the design method is improved, because, once the links have been integrated, the only operation the designer must perform to proceed with the design method is changing the value of the parameters of the model of the automotive module, since the characteristics of each link have been registered once and for all and can be reused each time as necessary.

Preferably, all the automotive modules are groups of modeled parts. A group of parts is a sub-set of the vehicle including several parts, which are usually functionally linked to each other. Thus, the design method can be used at a larger scale, i.e., not only for a component, but also for an organ, or for the vehicle itself. Advantageously, for each group of modeled parts, a pilot product comprising the history of the construction of said group of parts, and structured by function, on the one hand, and a result product that does not comprise the history of the construction of said group of parts, and structured by part, on the other hand, are associated to this group of modeled parts. Thus, the designer has, at the same time, on the one hand, an element having the minimum of required information to be integrated into the assembly, that is, the result product, and on the other hand, an element that is less easy to manipulate but richer in information content, making it possible to go back to a version older than the previous version, for example, if the design of an automotive module has taken a wrong direction and it seems opportune to go back to an older stage in the performance of the design method, that is, the pilot product.

The method for designing an automotive vehicle according to the invention is advantageously used in the area of designing automotive bodies. One of the operations is preferably an impact operation. Another operation is advantageously a vibratory acoustics operation.

The invention will now be described in details with reference to the Figures below, which are provided by way of illustrative and non-limitative examples, and in which.

Figure 1:
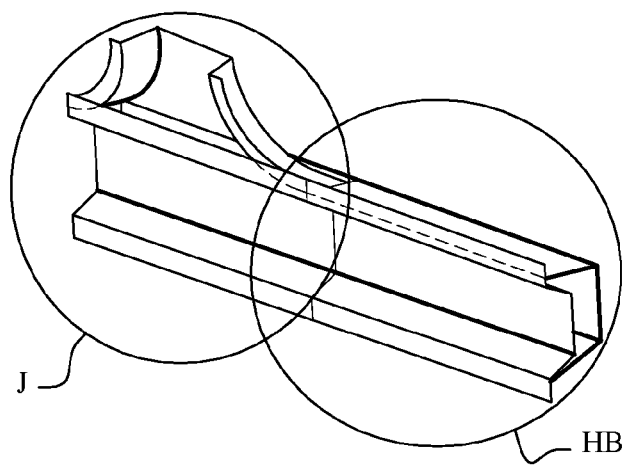
FIG. 1 is a schematic representation in graphical form of an example of pilot product.

FIG. 1 is a schematic representation in graphical form of an example of pilot product. The pilot product is functionally cut. It has a functional portion J of the junction type and a functional portion HB of the hollow body type. It can also have a functional portion of the panel type. The pilot product is a geometrical representation that contains, on the one hand, the parameterization, and on the other hand, the construction history.

Figure 2:
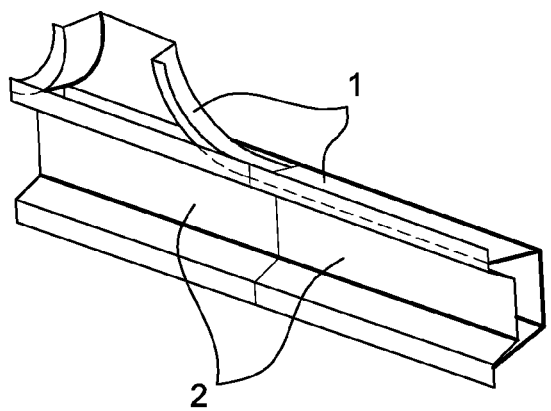
FIG. 2 is a schematic representation in graphical form of an example of result product.

FIG. 2 is a schematic representation in graphical form of an example of result product. The result product is cut into physical parts. It has a part 1 and a part 2. The result product is associated to the pilot product, it also contains the parameterization but the whole construction history has been removed. The result product is the element that will subsequently be used during the various following phases of the design method.

Figure 3:
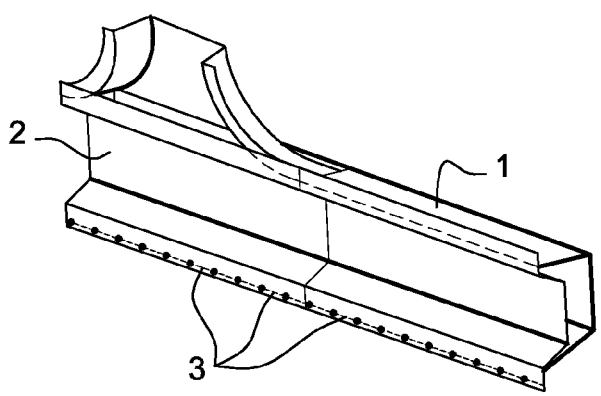
FIG. 3 is a schematic representation in graphical form of an example of assembly model.

FIG. 3 is a schematic representation in graphical form of an example of assembly model. Parts 1 and 2 are linked to each other via a link 3. This link 3 is, for example, of the ESW type, i.e., by "Electric Spot Welding" of a first category. The values of the characteristics of this link for each of the operations are found in a catalogue. For example, for the IMPACT operation, specific values, for the impact, of traction rigidity, rotation rigidity, mass, inertia, traction damping, rotation damping. For example, for the VIBRATORY ACOUSTICS operation, specific values, for the vibratory acoustics, of traction rigidity, rotation rigidity. Whereas the link 3 was created only once, the characteristic values of this link 3 are then specified for each operation, and thus, several times when various operations are taken into account.

Figure 4:
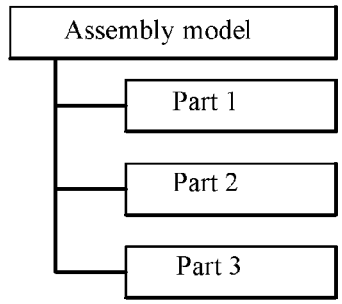
FIG. 4 is a schematic representation in functional form of an example of assembly model.

FIG. 4 is a schematic representation in functional form of an example of assembly model. An assembly model integrates the links existing among parts 1, 2, and 3.

Figure 5:
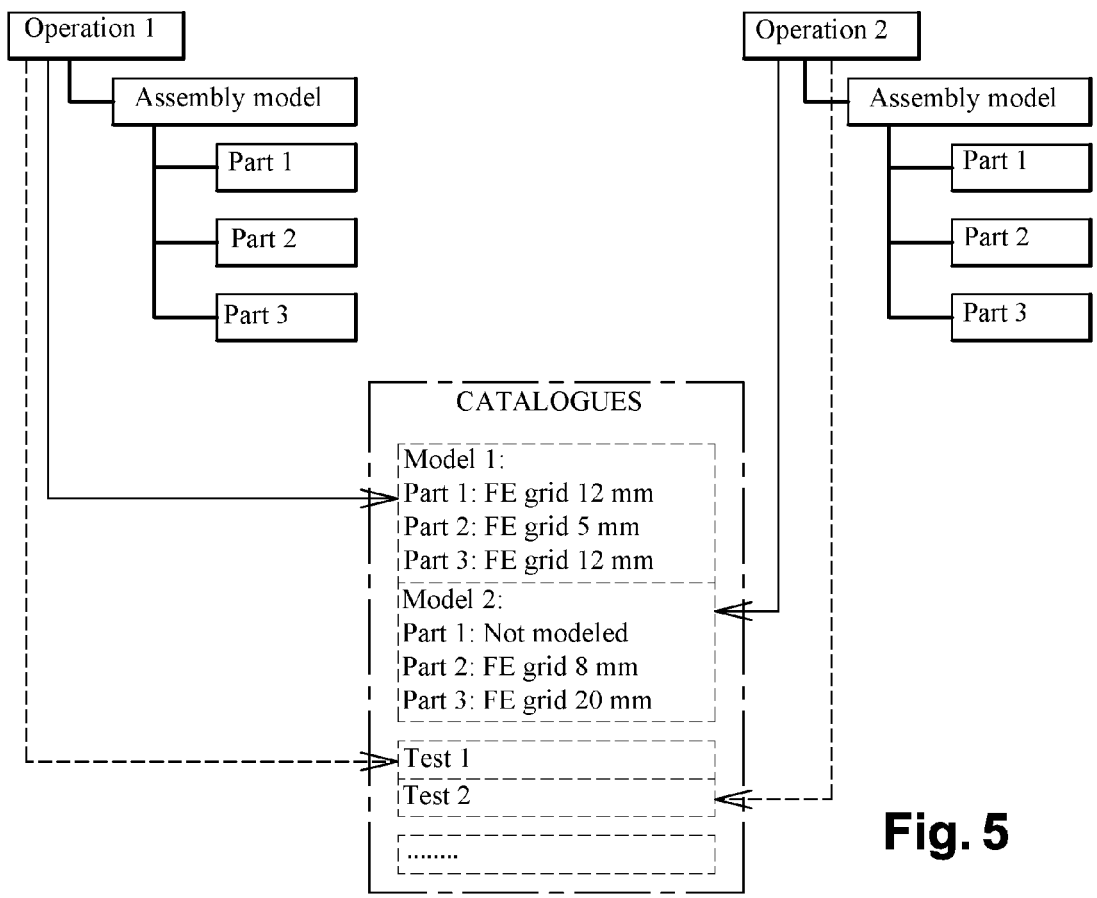
FIG. 5 is a schematic representation in functional form of an example of association of two operations to a same assembly model.

FIG. 5 is a schematic representation in functional form of an example of association of two operations to a same assembly model. An assembly model integrates the links existing among parts 1, 2, and 3. Two operations 1 and 2 are associated to the assembly model. For each of the operations 1 and 2, models 1 and 2 corresponding to operations 1 and 2, respectively, of the parts 1 to 3, as well as the conditions of the tests 1 and 2 corresponding to operations 1 and 2, respectively, are found in catalogues. For example, for operation 1, the part 1 must be modeled by a mapping in finite elements with a grid size of 12 mm. For example, for operation 1, the part 2 must be modeled by a mapping in finite elements with a grid size of 5 mm. For example, for operation 1, the part 3 must be modeled by a mapping in finite elements with a grid size of 12 mm. For example, for operation 2, the part 1 must not be modeled because it has no interest for operation 2. For example, for operation 2, the part 2 must be modeled by a mapping in finite elements with a grid size of 8 mm. For example, for operation 2, the part 3 must be modeled by a mapping in finite elements with a grid size of 20 mm.

Figure 6:
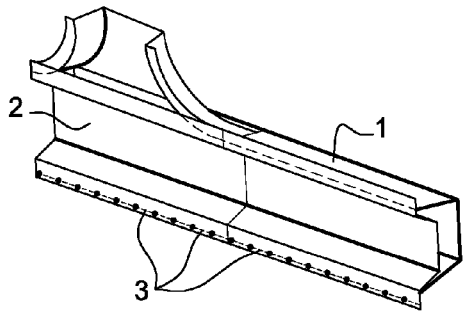
FIGS. 6 and 7 are schematic representation in graphical form of an example of association of two models of two operations, respectively, to a same assembly model.
Figure 7:
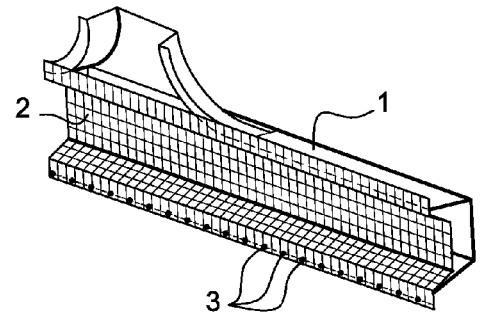

FIGS. 6 and 7 are schematic representations in graphical form of an example of association of two models of two operations, respectively, to a same assembly model. Two parts 1 and 2 are linked with each other by a link 3. On FIG. 6, for operation 1, the models of the parts 1 and 2 are geometrically parameterized. On FIG. 7, for operation 2, the model of the part 1 is geometrically parameterized, the model of part 2 being in finite elements.

Figure 8:
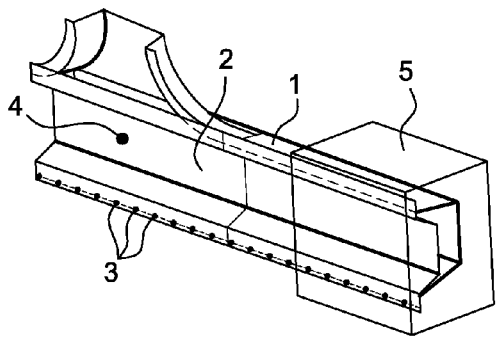
FIGS. 8 and 9 are schematic representations in graphical form of an example of data organization of FIGS. 6 and 7.
Figure 9:
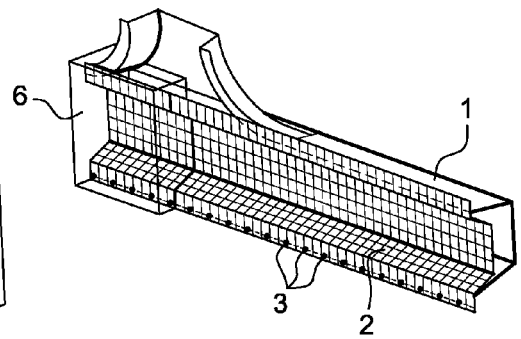

FIGS. 8 and 9 are schematic representations in graphical form of an example of data organization of FIGS. 6 and 7. For operation 1, a sensor 4, on the one hand, and a mass 5, on the other hand, are added on FIG. 8. For operation 2, a mass 6 is added on FIG. 9, at a different location from the mass 5 of FIG. 8. A number of data values are extracted from specification catalogues. For each part, the modeling type associated with each operation, parameterized geometrical representation or finite element modeling, the type of associated material and its physical characteristics, are extracted. For each link, the physical characteristics of the link are extracted. The test conditions and information on the elements used for data production, for example sensors or masses, and on their localization, are also extracted.

Figure 10:
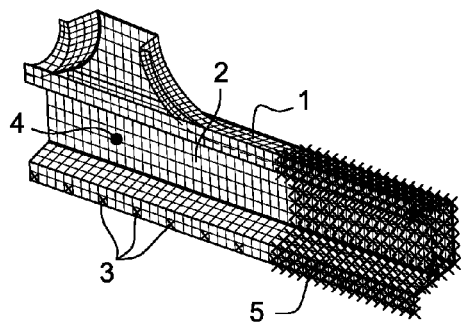
FIGS. 10 and 11 are schematic representations in graphical form of an example of mapping of FIGS. 8 and 9.
Figure 11:
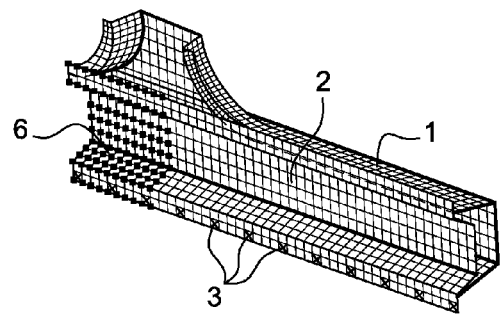

FIGS. 10 and 11 are schematic representations in graphical form of an example of mapping of FIGS. 8 and 9. On FIG. 10, for operation 1, elements 1 to 5 have been mapped. On FIG. 11, for operation 2, elements 1 to 3 and 6 have been mapped in a different way, the part 2 not having been mapped again since its model on FIGS. 7 and 9 was already a model in finite elements. The design method then creates automatically, for each of operations 1 and 2, the data file that is sent toward the digital simulation system to validate the models that have been performed.

Once the loop has been completed, the designer using the design method according to the invention can proceed with successive iterations. He modifies the parameters of the geometrical modeling in the pilot product. He updates the result product that is directly linked thereto, wherein a copy of the modifications of one of them can be transmitted to the other. The operations are updated, the data production being kept and updated. The mappings are updated automatically. The data files for the digital simulation are automatically regenerated.

The invention claimed is:

1. Method for designing an assembly of body parts or groups of body parts of an automotive vehicle body having a plurality of automotive modules using a digital simulation system, wherein each automotive module is an automotive vehicle body part or a group of automotive vehicle body parts, and wherein the plurality of automotive modules are functionally linked together by links, the method comprising:
   a step of integrating the automotive modules and the links, so as to form an assembly model for the assembly of body parts or groups of body parts,
   a step of modeling the automotive modules to create a model for each of the respective automotive modules,
   a step of associating, to the assembly model, at least two operations, wherein the respective operations require respective instantiations distinct from each other of the assembly model,
   a step of mapping the models of the automotive modules in finite elements and of mapping the links in finite elements to create at least one mapping in finite elements for each of the respective models and at least one mapping in finite elements for each of the links,
   wherein, in the mapping step, a first model mapping in finite elements and a second model mapping in finite elements distinct from the first model mapping are created for at least one of the models,
   wherein each of the instantiations of the assembly model includes a reference to at least one catalogue comprising respective test conditions for each of the at least two operations, wherein the respective test conditions for each of the at least two operations include mapping requirements for each of the respective models, wherein the mapping requirements for a first operation among the at least two operations include the first model mapping, and the mapping requirements for a second operation among the at least two operations include the second model mapping distinct from the first model mapping,
   a step of creating successively the instantiations of the assembly model, wherein the respective instantiations of the assembly model include the respective mappings of the assembly models in accordance with the mapping requirements of the catalogue, and
   a step of validating the instantiations of the assembly model by digital simulation,
   wherein the step of integrating the links is performed directly among the automotive modules, and not among the automotive models nor among the mappings of the automotive models, so that the assembly model is a geometric assembly of the automotive modules and the links, and does not include an assembly of the models, nor an assembly of the mappings, and successive instantiations of the assembly model do not require recalculating the mappings for the at least one model having first and second mappings, nor reintegrating the links, and
   wherein the step of creating successively the instantiations of the assembly model includes creating respective instantiations of the links by referring to a link instantiation catalogue that sets forth, for each link, a correspondence between said link and respective link parameters respectively corresponding to each of the at least two operations.

2. The method according to claim 1, wherein one or several of the automotive modules are modeled in a geometrical form and in a mapped form.

3. The method according to claim 1, wherein the sequence comprising the modeling step, the mapping step, the instantiations creating step and the validating step is repeated several times.

4. The method according to claim 1, wherein the at least one model for which the first model mapping and the second model mapping are created in the mapping step is not mapped again during the design method.

5. The method according to claim 1, wherein the method also comprises, between the association step and the mapping step, a step of data production which adds, for each operation, one or several additional elements to the assembly model.

6. The method according to claim 5, wherein, among the additional element or elements, there is one or several sensors.

7. The method according to claim 5, wherein, among the additional element or elements, there is one or several masses.

8. The method according to claim 1, wherein each of the automotive modules is a group of automotive vehicle body parts.

9. The method according to claim 8, wherein the model of each of the automotive modules is associated with (i) a pilot product comprising a history of a construction of said group of automotive vehicle body parts, and structured by function, and (ii) a result product that does not comprise the history of the construction of said group of automotive vehicle body parts, and structured by part.

10. The method according to claim 1, wherein one of the operations is an impact operation.

11. The method according to claim 1, wherein one of the operations is a vibratory acoustics operation.

12. The method according to claim 1, wherein the first operation is an impact operation and the second operation is a vibratory acoustics operation.

* * * * *